(12) United States Patent
Fiolka

(10) Patent No.: US 8,031,327 B2
(45) Date of Patent: Oct. 4, 2011

(54) ILLUMINATION SYSTEM OF A MICROLITHOGRAPHIC PROJECTION EXPOSURE APPARATUS

(75) Inventor: Damian Fiolka, Oberkochen (DE)

(73) Assignee: Carl Zeiss SMT GbmH, Oberkochen (DE)

( * ) Notice: Subject to any disclaimer, the term of this patent is extended or adjusted under 35 U.S.C. 154(b) by 649 days.

(21) Appl. No.: 12/058,993

(22) Filed: Mar. 31, 2008

(65) Prior Publication Data

US 2008/0266540 A1  Oct. 30, 2008

(30) Foreign Application Priority Data

Apr. 25, 2007 (DE) .......................... 10 2007 019 831

(51) Int. Cl.
G03B 27/54 (2006.01)
G03B 27/72 (2006.01)
(52) U.S. Cl. .......................................... 355/67; 355/71
(58) Field of Classification Search .................. 355/67, 355/53, 71
See application file for complete search history.

(56) References Cited

U.S. PATENT DOCUMENTS

| 6,535,273 | B1 | 3/2003 | Maul |
| 2001/0052968 | A1 | 12/2001 | Shiozawa |
| 2006/0055834 | A1 | 3/2006 | Tanitsu et al. |
| 2006/0158624 | A1 | 7/2006 | Toyoda |
| 2007/0014504 | A1 | 1/2007 | Fiolka |
| 2008/0074632 | A1 | 3/2008 | Tanitsu et al. |

FOREIGN PATENT DOCUMENTS

| DE | 198 29 612 | 1/2000 |
| DE | 10 2006 031 807 | 1/2007 |
| EP | 1 662 553 | 5/2006 |
| EP | 1 681 710 | 7/2006 |
| EP | 1 693 885 A1 | 8/2006 |
| JP | 2005-333001 | 12/2005 |
| WO | WO 2005/050718 | 6/2005 |
| WO | WO 2006/131517 | 12/2006 |
| WO | WO 2007/031544 | 3/2007 |

*Primary Examiner* — Peter B Kim
(74) *Attorney, Agent, or Firm* — Fish & Richardson P.C.

(57) ABSTRACT

The disclosure relates an illumination system that has an optical axis and a polarization-influencing arrangement. The arrangement can include a first wedge plate with a first wedge direction which extends perpendicularly to the optical axis in the direction of a maximum change in thickness of the first wedge plate, and a second wedge plate with a second wedge direction which extends perpendicularly to the optical axis in the direction of a maximum change in thickness of the second wedge plate. The first wedge plate and the second wedge plate can be arranged rotatably about the optical axis. The first wedge plate and the second wedge plate can be respectively made from birefringent crystal material having a respective optical crystal axis. In a starting position of the arrangement in which the first wedge direction and the second wedge direction extend in mutually parallel relationship, the optical crystal axis of the first wedge plate and the optical crystal axis of the second wedge plate can be oriented at an angle of 45°±3° relative to each other. One of the two crystal axes can be oriented perpendicularly or parallel to the preferred polarization direction of the light impinging on the arrangement.

20 Claims, 5 Drawing Sheets

ILLUMINATION SYSTEM OF A MICROLITHOGRAPHIC PROJECTION EXPOSURE APPARATUS

CROSS-REFERENCE TO RELATED APPLICATION

This application claims priority under 35 U.S.C. §119 to Germany Application No. 10 2007 019 831.2, filed on Apr. 25, 2007. The contents of this application is hereby incorporated by reference.

FIELD

The disclosure relates to an illumination system of a microlithographic projection exposure apparatus.

BACKGROUND

The production of light which as far as possible is unpolarized is desired in an illumination system of a microlithographic projection exposure apparatus for many uses. In general, the light emitted by the corresponding laser source is linearly polarized light. Accordingly, the linearly polarized light should be depolarized. To the extent that there is residual polarization, this can lead to effects as a consequence of polarization-dependent transmission or reflection properties of mirrors and because of AR-layers which are present on lenses and which are dependent in respect of their strength and the preferred polarization direction which is respectively obtained, on the illumination setting which is used.

An illumination system is known which includes an arrangement for modifying the degree of polarization, which in the direction of light propagation in succession has a lambda/4 plate, a lambda/2 plate and wedge-shaped deflection prisms which are freely rotatable in order to achieve a variation in the degree of polarization of the illumination light between a linear polarization state and an unpolarized state, via a change in the orientation of the optical crystal axes.

SUMMARY

In some embodiments, the disclosure provides an illumination system of a microlithographic projection exposure apparatus, which in a flexible fashion permits substantial or complete elimination of an unwanted preferred polarization direction even upon a variation in the illumination setting.

In one aspect, the disclosure provides an illumination system configured to be used in a microlithographic projection exposure apparatus. The illumination system has an optical axis, and the illumination system includes a first wedge plate having a first wedge direction extending perpendicularly to the optical axis in a direction of a maximum thickness of the first wedge plate. The illumination system also includes a second wedge plate having a second wedge direction extending perpendicularly to the optical axis in a direction of a maximum thickness of the second wedge plate. The first and second wedge plates are arranged rotatably about the optical axis. The first wedge plate includes a first birefringent crystal material having a first optical crystal axis. The second wedge plate includes a first birefringent crystal material having a second optical crystal axis. The direction of the first wedge plate and the direction of the second wedge extend in mutually parallel relationship. The first and second optical crystal axes are oriented at an angle of 45°±3° relative to each other.

In another aspect, the disclosure provides a microlithographic projection exposure apparatus that includes an illumination system as set forth in the preceding paragraph.

In a further aspect, the disclosure provides a process that includes using a microlithographic projection exposure apparatus set forth in the preceding paragraph to produce microstructured components.

In an additional aspect, the disclosure provides an illumination system configured to be used in a microlithographic projection exposure apparatus. The illumination system has an optical axis, and the illumination system includes a first wedge plate having a first wedge direction extending perpendicularly to the optical axis in a direction of a maximum thickness of the first wedge plate. The illumination system also includes a second wedge plate having a second wedge direction extending perpendicularly to the optical axis in a direction of a maximum thickness of the second wedge plate. The first and second wedge plates are arranged rotatably about the optical axis. The first wedge plate comprises a first birefringent crystal material having a first optical crystal axis. The second wedge plate comprises a first birefringent crystal material having a second optical crystal axis.

In certain embodiments, the disclosure provides an illumination system of a microlithographic projection exposure apparatus includes an optical axis and a polarization-influencing arrangement, wherein the arrangement includes:

a first wedge plate with a first wedge direction which extends perpendicularly to the optical axis in the direction of a maximum change in thickness of the first wedge plate; and a second wedge plate with a second wedge direction which extends perpendicularly to the optical axis in the direction of a maximum change in thickness of the second wedge plate;

wherein the first wedge plate and the second wedge plate are arranged rotatably about the optical axis;

wherein the first wedge plate and the second wedge plate are respectively made from birefringent crystal material having a respective optical crystal axis; and wherein in a starting position of the arrangement in which the first wedge direction and the second wedge direction extend in mutually parallel relationship the optical crystal axis of the first wedge plate and the optical crystal axis of the second wedge plate are oriented at an angle of 45°±3° relative to each other, wherein one of the two crystal axes is oriented perpendicularly or parallel to the preferred polarization direction of the light impinging on the arrangement.

The disclosure is based, at least in part, on the realization that highly flexible adjustment of a desired oriented degree of residual polarization can be effected both in respect of the strength and also in respect of the direction of the residual polarization via an independent rotatability of the wedge plates from the starting, more specifically with comparatively small rotational angles of the wedge plates of only a few degrees.

In the starting position of the wedge plates, unwanted beam deflection can be completely avoided—in relation to mutual compensation of the two wedge plates in respect of their beam deflection—and can be kept low in the case of relative rotation of the wedge plates out of the starting position selected in accordance with the disclosure, because of the small rotational angles that are desired. Slight beam deflection phenomena which may possibly still remain can be adjusted out via a subsequent adjustment of the laser beam or re-orientation of the pointing vector thereof.

Quantitative prediction or determination of the oriented residual polarization afforded via an arrangement, in respect of its strength and its preferred polarization direction, can be easily effected on the basis of simulation calculations on the assumption of a further polarizer arranged at a downstream position in the light propagation direction, the polarizer analyzing the light issuing from the wedge plate arrangement. Rotation of the polarizer about the optical axis of the illumination system then affords a different level of intensity modulation in dependence on the respective rotation of the wedge plates. While, in the unpolarized state of the light issuing from the arrangement, the intensity signal obtained after issuing from the polarizer is constant over the rotational angle of that polarizer, different modulation configurations in respect of intensity occur over the rotational angle of the polarizer, in the case of an at least partially linear polarization state or a linear residual polarization of the light issuing from the arrangement, depending on the respective strength and preferred polarization direction of the oriented residual polarization, in which case the strength of the oriented residual polarization arises out of the contrast relationship of the maxima and minima of the intensity modulation ($=[I_{Max}-I_{Min}]/[I_{Max}+I_{Min}]$) and wherein the preferred polarization direction arises out of the position of the maxima in respect of the respective intensity modulation.

As a result, complete or substantial elimination of an unwanted preferred polarization direction which is produced elsewhere in the illumination system can be achieved in a flexible manner and in dependence on the illumination setting which is respectively used (for example dipole setting, quadrupole setting and so forth), insofar as an oriented residual polarization afforded by the arrangement in a controlled manner is set depending on the respective strength and direction of the polarization effects to be compensated, caused elsewhere in the illumination system (by mirrors, AR-layers and so forth). It is possible in particular to dispense with additional rotatable lambda/2- and/or lambda/4-plates for adjusting the preferred polarization direction in relation to the orientation of the wedge plates.

In some embodiments, the starting position of the arrangement the optical crystal axis of the first wedge plate and the optical crystal axis of the second wedge plate are oriented at an angle of 45°±2° (e.g., an angle of 45°±1°, an angle of 45°±0.5°) relative to each other.

In certain embodiments, the wedge plate arrangement is disposed in the entrance region of the illumination system, desirably in the immediate proximity of the diffractive optical element (DOE) which is typically present there. That has the advantage that comparatively slight beam angles and relatively small beam pencil cross-sections then still occur in the region of the wedge plate arrangement, and that is advantageous in regard to the then small minimum dimensions of the wedge plate in view of the limitable availability of the crystalline material (for example crystalline quartz).

The disclosure further relates to a microlithographic projection exposure apparatus, a process for the microlithographic production of microstructured components and a microstructured component.

Further configurations of the disclosure are set forth in the description and the claims.

The disclosure is described in greater detail hereinafter via preferred embodiments by way of example with reference to the accompanying drawings, in which:

DETAILED DESCRIPTION

FIGS. 1*a-c* show a diagrammatic view of a polarization-influencing arrangement 10. In the cross-sectional view shown in FIG. 1*a* the arrangement 10 has two wedge plates 11 and 12 which are arranged in succession along an optical axis OA and whose respective light entrance surfaces are identified by 11*a* and 12*a* respectively and whose respective light exit surfaces are identified by 11*b* and 12*b* respectively. As indicated by the double-headed arrows P1 and P2 the two wedge plates 11 and 12 are arranged rotatably independently of each other about the optical axis OA. The spacing of the two wedge plates 11 and 12 is so selected that, upon relative rotation thereof about the optical axis OA, they do not collide with each other at least for the typically small rotational angles which are set in accordance with the disclosure (for example in the range of between −2° and +2°).

Figure 1:
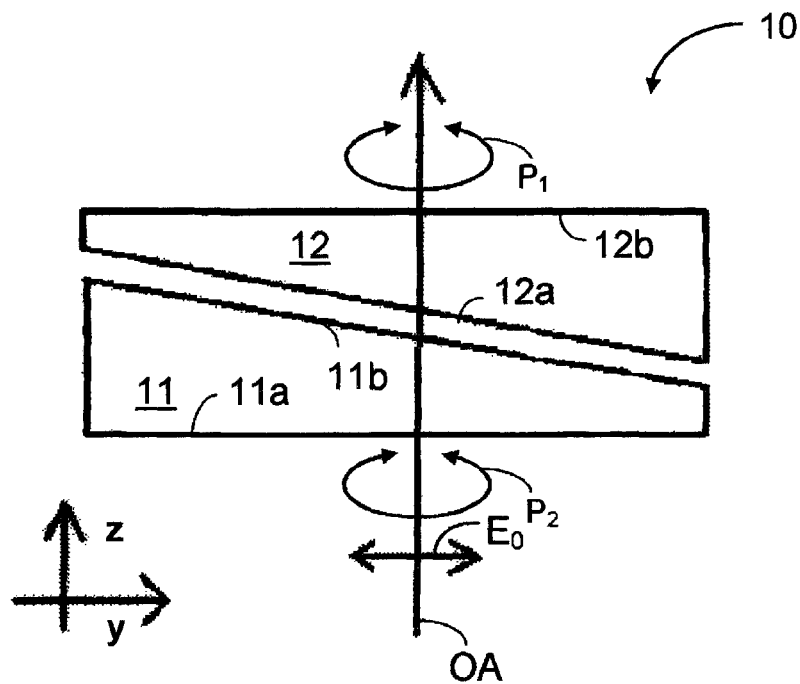
FIGS. 1*a-c* show diagrammatic views of a polarization-influencing arrangement in cross-section (FIG. 1*a*) and in a plan view onto the two wedge plates thereof (FIG. 1*b* and FIG. 1*c*) in accordance with a preferred embodiment.
Figure 1:
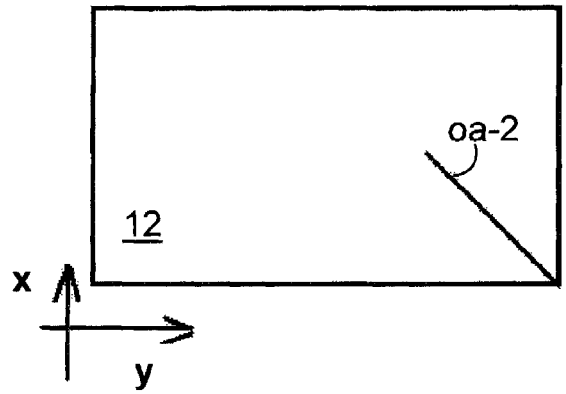
Figure 1:
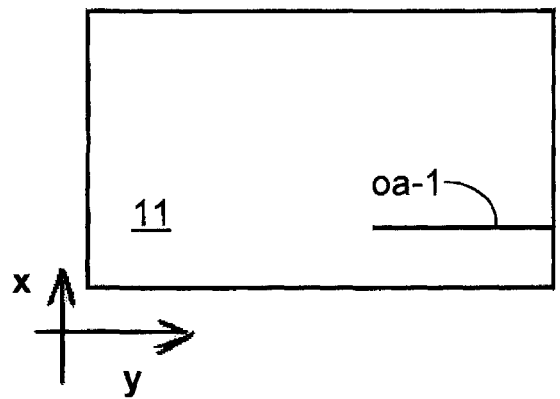

In the starting position shown in FIG. 1, the two wedge plates 11 and 12 supplement each other to afford a plane-parallel geometry in which the light exit surface 11*b* of the first wedge plate 11 and the light entrance surface 12*a* of the second wedge plate 12 are oriented in mutually parallel relationship, that is to say they are separated from each other by a gap of constant thickness. In comparison the light entrance surface 11*a* of the first wedge plate 11 and the light exit surface 12*b* of the second wedge plate 12 respectively extend perpendicularly to the optical axis OA (arranged in the z-direction).

In general the two wedge plates are so arranged in the starting position that the wedge directions thereof are oriented in mutually parallel relationship. In that respect the term wedge direction is used in each case to denote the direction which is perpendicular to the direction of light propagation (that is to say in FIG. 1*a* to the z-direction) and in which the change in thickness (that is to say the thickness gradient or the inclination) of the wedge plate in question is at a maximum. In FIG. 1*a* the wedge direction of both wedge plates respectively extends in the y-direction.

The two wedge plates 11 and 12 are each made from birefringent material, for example crystalline quartz or magnesium fluoride ($MgF_2$).

FIG. 1*b* shows a plan view of the second wedge plate 12 for the starting position of the arrangement 10 shown in FIG. 1*a* and FIG. 1*c* shows a plan view of the first wedge plate 11 for the starting position of FIG. 1*a*. In that case the orientation of the optical crystal axis in the corresponding birefringent wedge plates 11 and 12 is specified, being identified by oa-2 in FIG. 1*b* and oa-1 in FIG. 1*c*. Linearly polarized light impinges on the light entrance surface 11*a* of the first wedge plate 11 as shown in FIG. 1*a*, from a laser source (not shown in FIG. 1) (for example an ArF laser for a working wavelength of 193 nm), wherein the vibration direction of the electrical field strength vector (identified by $E_0$) is oriented in the y-direction in accordance with the illustrated embodiment. As shown in FIGS. 1b-c in the starting position the optical crystal axis oa-1 in the first wedge plate 11 extends in parallel relationship with that preferred polarization direction whereas the optical crystal axis oa-2 in the second wedge plate 12 is oriented at an angle of 45° to that preferred polarization direction (that is to say here relative to the small y-axis).

Figure 3:
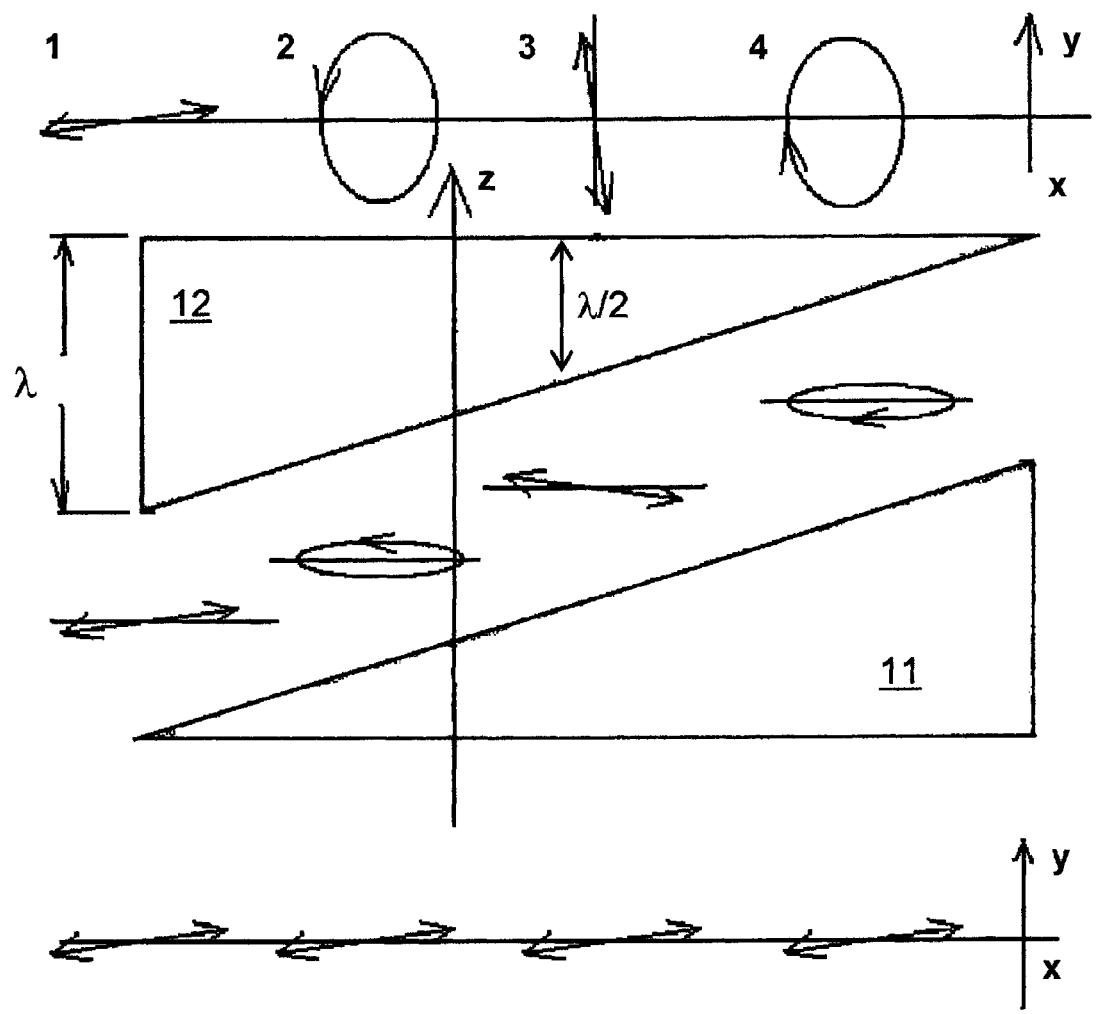
FIG. 3 shows a diagrammatic view to explain the mode of operation of the arrangement in the starting position of FIG. 1.

As will be described hereinafter with reference to FIG. 3 unpolarized light is produced for the starting position shown hereinbefore with reference to FIG. 1 (that is to say without rotation of the wedge plates 11 and 12 relative to each other or jointly as a unit in relation to the preferred polarization direction, extending in the y-direction, of the light impinging on the arrangement 10), on issuing from the arrangement 10. As described in the applicants' earlier patent application WO 2006/131517 A2, that also applies in a good approximation in regard to slight deviations in the orientation of linear polarization from the target orientation (extending in the y-direction) when passing into the arrangement 10. Of the light beams shown here in the diagrammatic view in FIG. 3, beam 1 (the polarization state of which remains unchanged after issuing from the arrangement 10) and beam 3 (the polarization direction of which is perpendicular to the polarization direction of the beam 1 after issuing from the arrangement 10) are incoherently superimposed and thus cancel each other out to give unpolarized light. The beams identified by 2 and 4, after issuing from the arrangement 10, respectively give circularly polarized light with handedness of opposite sign, in which respect a preferred direction in the x- or y-direction remains only in the situation involving a deviation in the orientation of the entrance polarization from the ideal orientation along the y-direction.

As a consequence of the independent rotatability of the wedge plates 11 and 12 about the optical axis OA, both the relative position thereof with respect to each other (and thus the orientation of the respective optical crystal axes oa-1 and oa-2 with respect to the preferred polarization direction of the incident light) and also the orientation of the overall arrangement 10, in relation to the preferred polarization direction of the incident light, can be continuously and targetedly changed.

As will be described hereinafter with reference to FIGS. 2a-o, significant variations in an oriented residual polarization produced by the arrangement 10 can already be caused with slight rotational angles of the wedge plates 11 and 12 (for example in the range of between −2° and +2°). That oriented residual polarization can in turn serve to provide an oriented allowance for a residual polarization which is present elsewhere in the illumination system (for example caused by mirrors or AR layers), in which respect, by virtue of the flexible rotatability of the wedge plates 11 and 12, it is possible to specifically take account of a variation in the last-mentioned polarization to be compensated, upon a change in the illumination setting.

Figure 2:
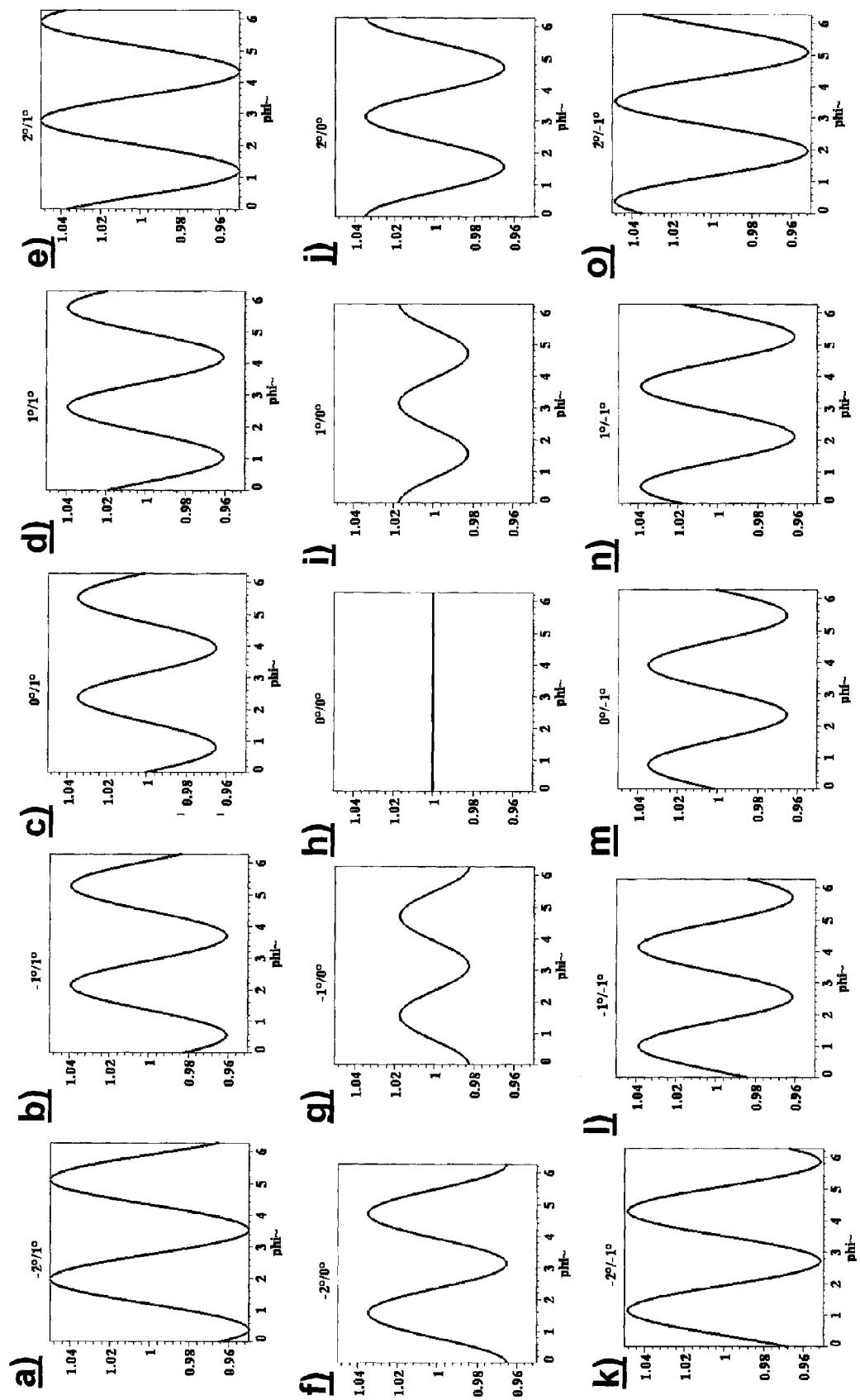
FIGS. 2*a-o* show different intensity modulation configurations which were ascertained on the assumption of a polarizer which is arranged downstream of the arrangement in the direction of light propagation and which rotates about the optical axis, more specifically for respectively different rotational angles of the wedge plates.

The diagrams shown in FIG. 2a-o each show the respective results of simulation calculations in which a polarizer disposed downstream of the arrangement 10 forms the basis for analysis of the polarization state of the light issuing from the arrangement 10. The rotational angle of that polarizer about the optical axis OA in the unit rad is specified in each case on the horizontal axis of those diagrams. The intensity of the light issuing from the polarizer is plotted on the vertical axis. The pairs of values specified right at the top in each of those diagrams respectively denote the rotational angles of the wedge plates 11 and 12 from the starting position described with reference to FIG. 1, in which respect the first angle of the respective pairs of values respectively specifies the rotational angle of the second wedge plate 12 and the second angle of the respective pair of values respectively denotes the rotational angle of the first wedge plate 11. The diagram in FIG. 2h thus corresponds to the starting position with reference to FIG. 1, as the two rotational angles defined hereinbefore are each of the value 0°.

As, for that starting position, the light entering the polarizer which forms the basis for the simulation calculation does not have a preferred direction, here there is a constant intensity pattern over the entire range of rotational angles of the polarizer. Furthermore, as can be seen from the other diagrams 2a-g and 2i-o, a rotation in the range of up to ±2° of one of the wedge plates 11 and 12 or both wedge plates 11, 12 already leads to a significant oriented residual polarization of the light passing into the polarizer assumed to be adopted in the simulation calculation, in which case both the strength and the direction of that oriented residual polarization can already be varied in a wide range with the specified, comparatively low rotational angles of the wedge plates. In that respect, the strength of the oriented residual polarization respectively arises out of the contrast relationship (maximum−minimum/maximum+minimum) of the intensity maxima and minima in the diagrams of FIGS. 2a-o whereas the preferred polarization direction follows from the position of the maxima as for same, the passage of light through the notional polarizer or the polarizer forming the basis for the simulation calculation is at a maximum. By way of example, the diagram of FIG. 2a, for a rotational angle of the second wedge plate 12 of −2° and a rotational angle of the first wedge plate 11 of +1°, shows the position of the first maximum in respect of intensity modulation at about phi=2 rad, which corresponds to an angle of the preferred polarization direction of about 114.6° with respect to the y-axis (here assumed to extend through the origin, without limitation in terms of generality).

Figure 4:
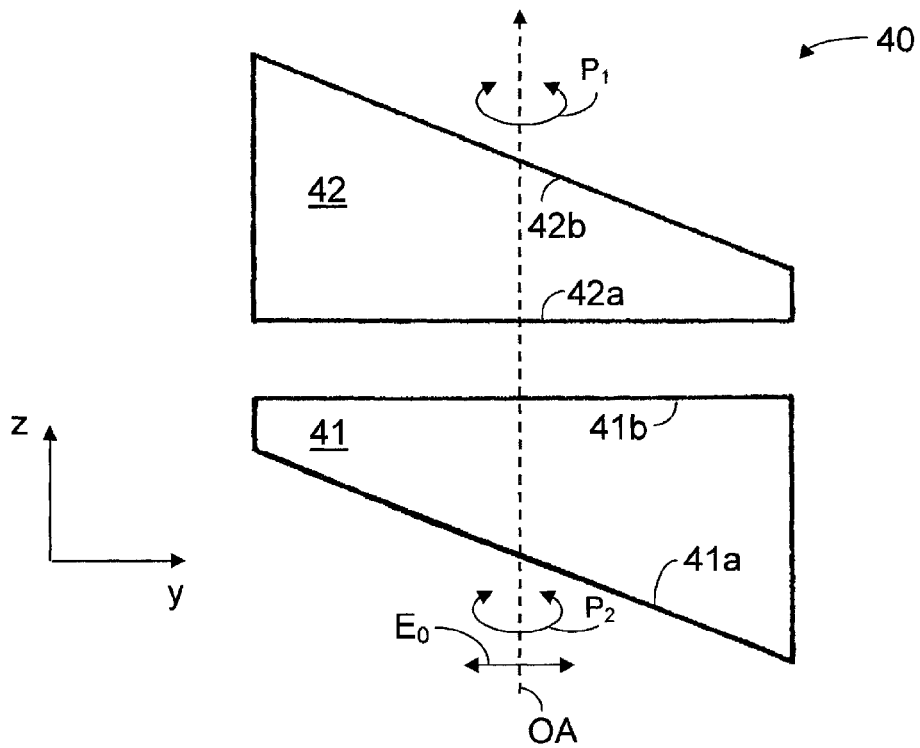
FIGS. 4 and 5 show diagrammatic views to explain a respective polarization-influencing arrangement in accordance with alternative embodiments of the disclosure.
Figure 5:
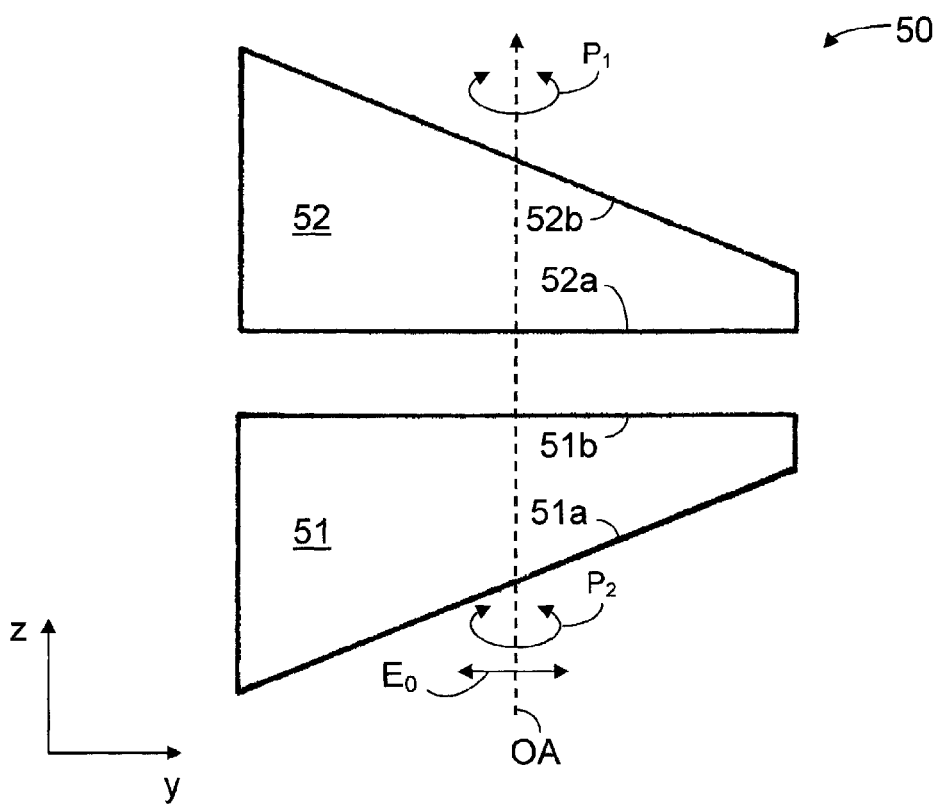

FIGS. 4 and 5 show diagrammatic views to describe a respective polarization-influencing arrangement in accordance with alternative embodiments of the disclosure.

FIG. 4 only diagrammatic shows a polarization-influencing arrangement 40 which, similarly to FIG. 1, is made up of two wedge plates 41 and 42 which are arranged rotatably independently of each other about the optical axis OA and which each include birefringent material (for example crystalline quartz or magnesium fluoride).

Unlike the arrangement 10 in FIG. 1a however, in the arrangement 40 in FIG. 4 the wedge surfaces 41a and 42b of the wedge plates 41 and 42, which surfaces are respectively inclined with respect to the optical axis OA, are arranged "outwardly", that is to say on the side remote from the respective other wedge plate, whereas the wedge surfaces 41b and 42a which are perpendicular to the optical axis OA are arranged in each case "inwardly", that is to say on the side towards the respective other wedge plate. The "outward" wedge surfaces 41a and 42b which are inclined with respect to the optical axis OA, that is to say the light entrance surface of the first wedge plate 41 and the light exit surface of the second wedge plate 42, are in turn arranged in mutually parallel relationship. Accordingly, the arrangement 40 only introduces a beam displacement which can be easily corrected.

The description relating to the arrangement 10 in FIG. 1 similarly applies in respect of the orientations of the optical crystal axes in the wedge plates 41 and 42. That means that once again the optical crystal axes of the wedge plates 41 and 42 are oriented at an angle of 45° relative to each other, wherein one of those two optical crystal axes is oriented either perpendicularly or parallel to the vibration direction of the electrical field strength vector (identified by $E_0$) (extending in the y-direction in the illustrated embodiment).

In accordance with a further embodiment, diagrammatically illustrated in FIG. 5, of an arrangement 50 with wedge plates 51 and 52, in which the wedge surfaces 51a and 52b which are inclined with respect to the optical axis OA are also arranged "outwardly", that is to say on the side remote from the respective other wedge plate, those inclined wedge surfaces 51a and 52b may also be designed in such a way as to extend in non-parallel relationship but rather in mutually converging relationship. As in the above-described arrangement 40 shown in FIG. 4 however, the arrangement 50 in FIG. 5 provides that the wedge directions of the wedge plates 51 and 52 also extend in mutually parallel relationship. In that respect the wedge direction is defined as that direction which is perpendicular to the optical axis OA or the direction of light propagation and in which the change in thickness of the wedge plate in question is at a maximum. In the embodiments of FIGS. 4 and 5 all wedge directions of the wedge plates 41 and 42, 51 and 52 respectively extend in the y-direction, in accordance with the illustrated co-ordinate system.

In other respects the description relating to FIG. 1 and FIG. 4 respectively similarly applies in relation to the orientations of the optical crystal axes of the wedge plates 51 and 52 of the arrangement 50 shown in FIG. 5, in other words, the optical crystal axes of the wedge plates 51 and 52 are again oriented at an angle of 45° relative to each other in the illustrated starting position, wherein one of those two optical crystal axes is parallel or perpendicular to the preferred polarization direction of the light impinging on the arrangement 50.

A beam angle which is introduced by the arrangement 50 in FIG. 5 can be easily compensated by laser pointing.

Figure 6:
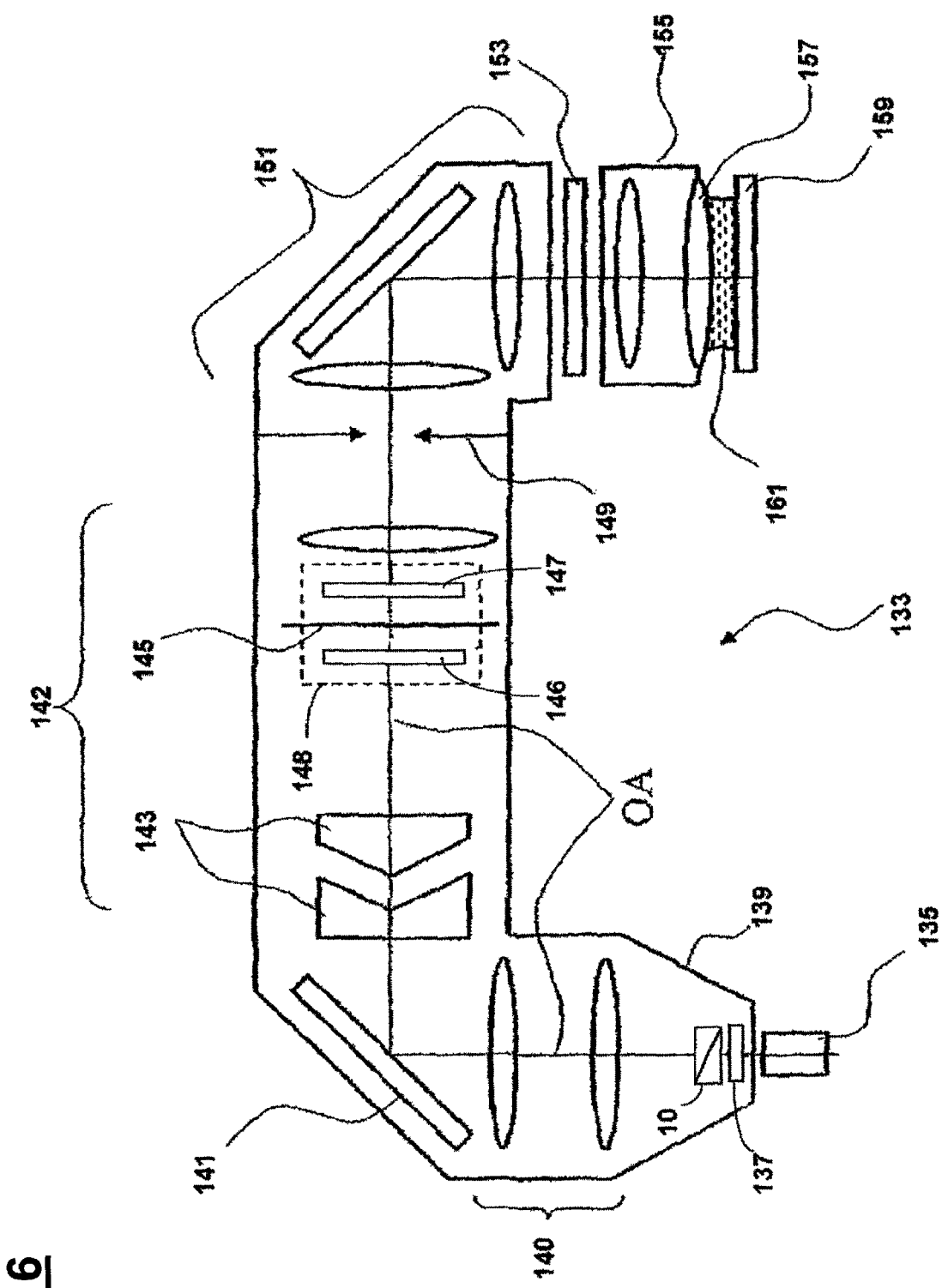
FIG. 6 shows a diagrammatic view illustrating the structure of a microlithographic projection exposure apparatus having an illumination system.

To illustrate use of the arrangement FIG. 6 is a diagrammatic view showing a microlithographic projection exposure apparatus 133 having a light source unit 135, an illumination system 139, a structure-bearing mask 153, a projection objective 155 and a substrate 159 to be exposed. The light source unit 135 as the light source may include for example an ArF laser for a working wavelength of 193 mm as well as a beam-forming optical system which produces a parallel light bundle.

In the illustrated embodiment the parallel light beam firstly impinges on a diffractive optical element 137. The diffractive optical element 137 produces a desired intensity distribution, for example dipole or quadrupole distribution, in a pupil plane 145, by way of an angle reflection characteristic defined by the respective diffractive surface structure. Disposed after the diffractive optical element 137 in the light propagation direction, as shown in FIG. 6, is the polarization-influencing arrangement 10, with wedge plates rotatable independently of each other. The rotational angles of those wedge plates can be flexibly set in dependence on the respectively currently used illumination setting (optionally via a control device (not shown) and suitable actuators).

In accordance with a further use of the arrangement 10 firstly a residual polarization which is present elsewhere in the illumination system 139 (caused for example by mirrors, AR layers etc.) and which is to be compensated can also be ascertained, then the appropriate relative position of the wedge plates 11 and 12 can be correspondingly selected and finally the arrangement 10 can be fitted into the illumination system 139 in a suitable fixed position.

An objective 140 which follows in the beam path along the optical axis OA is in the form of a zoom objective which produces a parallel light beam of variable diameter. The parallel light beam is directed by a deflection mirror 141 onto an optical unit 142 having an axicon 143. Different illumination configurations are generated by the zoom objective 140 in conjunction with the upstream-disposed DOE 137 and the axicon 143, in the pupil plane 145, depending on the respective zoom setting and the position of the axicon elements. After the axicon 143 the optical unit 142 includes a light mixer system 148 which is arranged in the region of the pupil plane 145 and which here has in per se known manner an arrangement suitable for producing a light mixing effect, consisting of microoptical elements (represented by the elements 146 and 147 in FIG. 6). The light mixer system can alternatively also involve a honeycomb condenser or an integrator rod of material transparent to light at the working wavelength such as for example quartz glass or also crystalline calcium fluoride. The optical unit 142 is followed by a reticle masking system (REMA) 149, the image of which is formed by an REMA objective 151 on the structure-bearing mask (reticle) 153 and thereby defines the illuminated region on the reticle 153. The structure-bearing mask 153 is projected with a projection objective 155 onto a substrate 159 to be exposed. In the illustrated embodiment, disposed between a last optical element 157 of the projection objective and the light-sensitive substrate 159 is an immersion fluid 161 with a refractive index which is different from air.

Although the disclosure has been described via specific embodiments numerous variations and alternative embodiments will be apparent to one skilled in the art, for example by combination and/or exchange of features of individual embodiments. Accordingly it will be appreciated by one skilled in the art that such variations and alternative embodiments are also embraced by the present disclosure and the scope of the disclosure is limited only in the sense of the accompanying claims and equivalents thereof.

What is claimed is:

1. An illumination system having an optical axis, the illumination system comprising:
    a first wedge plate having a first wedge direction extending perpendicularly to the optical axis in a direction of a maximum thickness of the first wedge plate; and
    a second wedge plate having a second wedge direction extending perpendicularly to the optical axis in a direction of a maximum thickness of the second wedge plate;
    wherein:
        the first and second wedge plates are arranged rotatably about the optical axis;
        the first wedge plate comprises a second birefringent crystal material having a first optical crystal axis;
        the second wedge plate comprises a first birefringent crystal material having a second optical crystal axis;
        the first and second wedge plates are rotatable independently of each other about the optical axis;
        when the first and second wedge directions are parallel to each other, the first and second optical crystal axes are oriented at an angle from 42° to 48° relative to each other; and
        the illumination system is configured to be used in a microlithographic projection exposure apparatus.

2. The illumination system as set forth in claim 1, wherein when the first and second wedge directions are parallel to each other, the first and second optical crystal axes are oriented at an angle from 43° to 47° relative to each other.

3. The illumination system as set forth in claim 2, further comprising a diffractive optical element, wherein when light propagates through the illumination system along a light propagation direction the first and second wedge plates are in direct succession downstream of the diffractive optical element in the light propagation direction.

4. The illumination system as set forth in claim 2, further comprising a control device and actuators, wherein the actuators are actuatable via the control device to set a first rotational angle of the first wedge plate and a second rotational angle of the second wedge plate.

5. The illumination system as set forth in claim 4, wherein the control device is configured so that a disturbance in the polarization distribution which is caused elsewhere in the illumination system is compensated at least partially by the first and second wedge plates.

6. The illumination system as set forth in claim 1, wherein when the first and second wedge directions are parallel to each other, the first and second optical crystal axes are oriented at an angle from 44° to 46° relative to each other.

7. The illumination system as set forth in claim 1, wherein when the first and second wedge directions are parallel to each other, the first and second optical crystal axes are oriented at an angle from 44.5° to 45.5° relative to each other.

8. The illumination system as set forth in claim 1, further comprising a diffractive optical element, wherein when light propagates through the illumination system along a light propagation direction the first and second wedge plates are in direct succession downstream of the diffractive optical element in the light propagation direction.

9. The illumination system as set forth in claim 1, further comprising a control device and actuators, wherein the actuators are actuatable via the control device to set a first rotational angle of the first wedge plate and a second rotational angle of the second wedge plate.

10. The illumination system as set forth in claim 9, wherein the control device actuates the actuators based on an illumination setting of the illumination system.

11. The illumination system as set forth in claim 9, wherein the control device is configured so that a disturbance in the polarization distribution which is caused elsewhere in the illumination system is compensated at least partially by the first and second wedge plates.

12. The illumination system as set forth in claim 1, wherein:
the first wedge plate has a flat light entrance surface perpendicular to the optical axis;
the first wedge plate has a flat light exit surface inclined with respect to the optical axis;
the second wedge plate has a flat light entrance surface inclined with respect to the optical axis;
the second wedge plate has a flat light exit surface perpendicular to the optical axis; and
the light exit surface of the first wedge plate is parallel to the light entrance surface of the second wedge plate.

13. The illumination system as set forth in claim 1, wherein first birefringent crystal material is the same as the second birefringent crystal material.

14. The illumination system as set forth in claim 1, wherein at least one of the first and second birefringent crystal materials is crystalline quartz or magnesium fluoride.

15. The illumination system as set forth in claim 1, wherein both the first and second birefringent crystal materials are crystalline quartz or magnesium fluoride.

16. An apparatus, comprising:
an illumination system as set forth in claim 1,
wherein the apparatus is a microlithographic projection exposure apparatus.

17. The apparatus as set forth in claim 16, further comprising a projection objective.

18. A process, comprising:
providing a microlithographic projection exposure apparatus, the microlithographic projection exposure apparatus comprising an illumination system as set forth in claim 1 and a projection objective; and
using the microlithographic projection exposure apparatus to project a portion of a mask having features onto a region of a light-sensitive layer supported by a substrate.

19. The process as set forth in claim 18, comprising:
illuminating the mask with light produced by the illumination system; and
after illuminating the mask, using the projection objective to project the portion the mask onto the region of the light-sensitive layer.

20. The process as set forth in claim 18, wherein the process produces a microstructured component.

\* \* \* \* \*

UNITED STATES PATENT AND TRADEMARK OFFICE
CERTIFICATE OF CORRECTION

PATENT NO.         : 8,031,327 B2                                    Page 1 of 1
APPLICATION NO.    : 12/058993
DATED              : October 4, 2011
INVENTOR(S)        : Damian Fiolka It is certified that error appears in the above-identified patent and that said Letters Patent is hereby corrected as shown below:

Column 10,
Line 36, Delete "portion" and insert --portion of--

Signed and Sealed this
Twenty-ninth Day of November, 2011

David J. Kappos
*Director of the United States Patent and Trademark Office*

UNITED STATES PATENT AND TRADEMARK OFFICE
CERTIFICATE OF CORRECTION

PATENT NO.       : 8,031,327 B2        Page 1 of 1
APPLICATION NO.  : 12/058993
DATED            : October 4, 2011
INVENTOR(S)      : Damian Fiolka It is certified that error appears in the above-identified patent and that said Letters Patent is hereby corrected as shown below:

Title page, Item (73) Assignee, delete "Carl Zeiss SMT GbmH" insert -- Carl Zeiss SMT GmbH --

Signed and Sealed this
Thirteenth Day of March, 2012

David J. Kappos
*Director of the United States Patent and Trademark Office*